US009048376B2

(12) United States Patent
Lin et al.

(10) Patent No.: US 9,048,376 B2
(45) Date of Patent: Jun. 2, 2015

(54) SOLAR CELL DEVICES AND APPARATUS COMPRISING THE SAME

(75) Inventors: Yi-Chieh Lin, Hsinchu (TW); Shih-Chang Lee, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 225 days.

(21) Appl. No.: 12/962,108

(22) Filed: Dec. 7, 2010

(65) Prior Publication Data

US 2011/0132447 A1    Jun. 9, 2011

(30) Foreign Application Priority Data

Dec. 7, 2009 (TW) ................. 98141861 A

(51) Int. Cl.

| H01L 31/06 | (2012.01) |
|---|---|
| H01L 31/18 | (2006.01) |
| H01L 31/052 | (2014.01) |
| H01L 31/0725 | (2012.01) |
| H01L 31/0735 | (2012.01) |
| H01L 31/054 | (2014.01) |

(52) U.S. Cl.
CPC .......... *H01L 31/1892* (2013.01); *H01L 31/052* (2013.01); *H01L 31/0725* (2013.01); *H01L 31/0735* (2013.01); *H01L 31/1852* (2013.01); *Y02E 10/52* (2013.01); *Y02E 10/544* (2013.01); *H01L 31/0543* (2013.01)

(58) Field of Classification Search
CPC .............. H01L 31/052; H01L 31/0524; H01L 31/0725; H01L 31/0735
USPC .......................................... 136/255, 262, 252
See application file for complete search history.

(56) References Cited

U.S. PATENT DOCUMENTS

| 4,667,059 | A * | 5/1987 | Olson ........................... 136/249 |
|---|---|---|---|
| 6,316,715 | B1 * | 11/2001 | King et al. .................... 136/255 |
| 6,340,788 | B1 * | 1/2002 | King et al. .................... 136/261 |
| 6,399,874 | B1 * | 6/2002 | Olah .............................. 136/259 |
| 7,119,271 | B2 * | 10/2006 | King et al. .................... 136/252 |
| 7,126,052 | B2 * | 10/2006 | Fetzer et al. .................. 136/252 |
| 7,960,201 | B2 * | 6/2011 | Cornfeld et al. ................. 438/66 |
| 8,039,291 | B2 * | 10/2011 | Cornfeld et al. ................. 438/87 |
| 8,101,856 | B2 * | 1/2012 | Hovel ............................ 136/261 |
| 8,143,513 | B2 * | 3/2012 | Chiou et al. ................... 136/255 |
| 8,227,689 | B2 * | 7/2012 | King et al. .................... 136/261 |
| 8,263,853 | B2 * | 9/2012 | Varghese ....................... 136/249 |
| 8,299,351 | B2 * | 10/2012 | Hsu ............................... 136/255 |
| 2001/0018924 | A1 * | 9/2001 | Hisamatsu et al. ........... 136/249 |
| 2004/0079408 | A1 * | 4/2004 | Fetzer et al. .................. 136/262 |
| 2004/0166681 | A1 * | 8/2004 | Iles et al. ...................... 438/689 |
| 2006/0144435 | A1 * | 7/2006 | Wanlass ........................ 136/249 |
| 2006/0162768 | A1 * | 7/2006 | Wanlass et al. ............... 136/262 |
| 2008/0190479 | A1 * | 8/2008 | Hsieh et al. ................... 136/246 |

OTHER PUBLICATIONS

King, et al., "Lattice-Matched and Metamorphic GaInP/GaInAs/Ge Concentrator Solar Cells", 3rd World Conference on Photovoltaic Energy Conversion, May 11-18, 2003, Osaka, Japan, pp. 622-625.

* cited by examiner

*Primary Examiner* — Golam Mowla
(74) *Attorney, Agent, or Firm* — Muncy, Geissler, Olds & Lowe, P.C.

(57) ABSTRACT

A multi-junction solar cell device includes a substrate having a first lattice constant, a first optoelectronic conversion layer having a second lattice constant, and a second optoelectronic conversion layer having a third lattice constant wherein the value of the first lattice constant is between that of the second lattice constant and the third lattice constant.

17 Claims, 6 Drawing Sheets

SOLAR CELL DEVICES AND APPARATUS COMPRISING THE SAME

TECHNICAL FIELD

The application relates to a multi junction solar cell device, and more particularly to a good strain-balanced multi-junction solar cell device.

DESCRIPTION OF BACKGROUND ART

Along with the development of the economy, in order to raise the output of the products and to gain more profit, the labor-intensive industry has moved to equipment-intensive one. After the industrial revolution, to produce products, the electricity becomes the main power source. The way to acquire the electricity also becomes the international main concern. Compared with the contaminating energy such as the petroleum, the coal, and the nuclear energy, the solar energy is a kind of energy which makes no pollution, provides the energy of equivalent 180 watts per meter square to the surface of the earth, and has no problem with the energy monopolization. Therefore, the solar energy has become one of the most potential energy in the future.

Since the first solar cell produced in Bell's laboratory in the United States in 1954, various kinds of solar cells with different structures have been disclosed afterwards. The solar cells can be classified as the silicon-based solar cell, the multi junction semiconductor solar cell, the dye sensitized solar cell, and the organic conductive polymer solar cell and so on in accordance with the difference of the materials. In accordance with FIG. 1, take the conventional silicon-based solar cell device 1 for example, the structure comprises a first electrode 12, a silicon substrate 17, a p-type silicon semiconductor layer 14, an n-type semiconductor layer 15, and a second electrode 16. The sun light 10 illuminates the solar cell device 1 and provides the p-type silicon semiconductor layer 14 and the n-type semiconductor layer 15 the energy which is larger than the band gap of the Si semiconductor layer. After the atoms in the silicon semiconductor layer absorbing the energy, the free carriers (electrons/holes) are produced. The produced electrons move toward the n-type semiconductor layer 15, the produced holes move toward the p-type semiconductor layer 14, and the electric potential difference is produced because the positive and the negative charges accumulate near the p-n junction between the p-type silicon semiconductor layer 14 and the n-type semiconductor layer 15. Due to the electric potential difference, the accumulated electrons flow to the external circuit (not shown in the figures) from the first electrode 12 to the second electrode 16 to generate the current in the external circuit. Meanwhile, if a load (not shown in the figures) is added in the external circuit, the produced electric energy can be collected and stored. Herein, the combination of the p-type silicon semiconductor layer 14 and the n-type semiconductor layer 15 which can absorb a light with a specified wavelength range and produce a current in the external circuit is also called an optical-electric conversion layer 11.

FIG. 2 shows the spectrum of the solar energy radiation on the surface of the earth. In accordance with the spectrum, the distribution of the solar energy on the surface of the earth, besides the visible light, the IR and the ultraviolet light also distribute. Nevertheless, due to the basic mechanism of the solar cell as mentioned above, only the solar energy equal to or larger than the band gap of the semiconductor layer can be absorbed in the traditional semiconductor solar cell structure. Take silicon for example, the band gap of silicon is about 1.12 eV, so it can absorb only part of the energy with the wavelength in the IR range in the spectrum. Besides, in consideration of the internal loss of the solar cell, the low conversion efficiency of the solar cell is indeed a problem.

In order to improve the aforementioned problem, a multi junction solar cell is developed and has become one of the solar cell structures with the highest conversion efficiency.

Refer to FIG. 3, 3 is a kind of the multi-junction solar cell device, which comprises a three optical-electric conversion layers (p-n junctions) of Ge/$Ga_{1-y}In_yAs$/$Ga_{1-x}In_xP$ inside the device. The multi junction solar cell device 3 comprises a first electrode 32, a Ge substrate 35, a first optical-electric conversion layer 31 composed of Ge, a second optical-electric conversion layer 33 composed of $Ga_{1-y}In_yAs$, a third optical-electric conversion layer 34 composed of $Ga_{1-x}In_xP$, and a second electrode 36. Each optical-electric conversion layer is a p-n junction formed by the combination of one p-type semiconductor layer and one n-type semiconductor layer. Accordingly, the first Ge optical-electric conversion layer 31 is a p-n junction formed by the combination of a p-type Ge semiconductor layer 311 (p-Ge) and an n-type Ge semiconductor layer 312 (n-Ge); the second $Ga_{1-y}In_yAs$ optical-electric conversion layer 33 is a p-n junction formed by the combination of a p-type $Ga_{1-y}In_yAs$ semiconductor layer 331 (p-$Ga_{1-y}In_yAs$) and an n-type $Ga_{1-y}In_yAs$ semiconductor layer 332 (n-$Ga_{1-y}In_yAs$); the third $Ga_{1-x}In_xP$ optical-electric conversion layer 34 is a p-n junction formed by the combination of a p-type $Ga_{1-x}In_xP$ semiconductor layer 341 (p-$Ga_{1-x}In_xP$) and an n-type $Ga_{1-x}In_xP$ semiconductor layer 342 (n-$Ga_{1-x}In_xP$). When the sun light 30 illuminates, in order to let the aforementioned multi optical-electric conversion layers absorb the solar energy efficiently, the optical-electric conversion layer nearest the sun is preferably a layer with the larger semiconductor band gap wherein the band gap decreases gradually to the desired band gap of the optical-electric conversion layers. Accordingly, the band gap of the $Ga_{1-x}In_xP$ optical-electric conversion layer 34 is larger than the band gap of the $Ga_{1-y}In_yAs$ optical-electric conversion layer 33, and the band gap of the $Ga_{1-y}In_yAs$ optical-electric conversion layer 33 is larger than the band gap of the Ge optical-electric conversion layer 31.

Besides, there is a first tunnel junction 38 between the first optical-electric conversion layer 31 and the second optical-electric conversion layer 33, and a second tunnel junction 39 between the second optical-electric conversion layer 33 and the third optical-electric conversion layer 34. The tunnel junctions locate between the optical-electric conversion layers to adjust the resistance between two adjacent optical-electric conversion layers, to reduce the charges accumulated near any side of the two adjacent optical-electric conversion layers, and to make the currents of the optical-electric conversion layers consistent.

When the sun light 30 passes through the upper $Ga_{1-x}In_xP$ optical-electric conversion layer 34 with higher band gap, the photon with higher energy is absorbed ($Ga_{1-x}In_xP$(1.85 eV; x~0.5), the absorbed spectrum is about from the ultraviolet to the visible light), and then, the central $Ga_{1-y}In_yAs$ optical-electric conversion layer 33 ($Ga_{1-y}In_yAs$(y~0.01)) absorbs the photon with the energy from the visible light to the IR part because its band gap is smaller than that of the $Ga_{1-x}In_xP$ optical-electric conversion layer. It also re-absorbs the higher energy light which is not absorbed by the upper $Ga_{1-x}In_xP$ optical-electric conversion layer 34 transmitting from the upper layer to this central layer and to recycle the solar energy more efficiently. Finally, because the Ge optical-electric conversion layer 31 comprises the lowest band gap, it can re-absorb the light with the energy larger than the IR light passing through the upper two layers. Referring to FIG. 4, FIG. 4 shows the spectrum response diagram of the multi junction solar cell device 3. One coordinate axis shows the absorbed wavelength and the other coordinate axis shows the percentage of the quantum efficiency. The higher the quantum efficiency is, the more efficiently the selected material absorbs the light with the corresponding wavelength and converts it into the electron-hole pairs in the solar cell. As shown in FIG. 4, because the multi junction solar cell with gradually increased band gaps from the substrate to the solar cell of the Ge/Ga$_{1-y}$In$_y$As/Ga$_{1-x}$In$_x$P composition comprises a broader and overlapping absorbing wavelength range, the solar energy can be used repeatedly and the solar cell can achieve the extremely high quantum efficiency. Therefore, such stacked multi junction solar cell has higher conversion efficiency.

However, the design of one multi-junction solar cell is not only depends on the match of the band gaps between the different optical-electric conversion layers, the current balance also should be achieved by adjusting the thicknesses of the different materials of the optical-electric conversion layers. Besides, the lattice constants of the materials of the optical-electric conversion layers also should be matched to reduce the defects of the solar cell during the producing process in order to improve the quality and the conversion efficiency of the solar cell devices.

Referring to FIG. 3, the main structures of the solar cell device 3 from the bottom are the Ge substrate 35, the Ge optical-electric conversion layer 31, the Ga$_{1-y}$In$_y$As optical-electric conversion layer 33, and the Ga$_{1-x}$In$_x$P optical-electric conversion layer 34. The lattice constant of the Ge substrate 35 and the Ge optical-electric conversion layer 31 is about 5.66 A, the lattice constant of the Ga$_{1-y}$In$_y$As optical-electric conversion layer 33 is about 5.64 A, and the lattice constant of the Ga$_{1-x}$In$_x$P optical-electric conversion layer 34 is also about 5.64 A. Therefore, to the Ge substrate 35, the lattice constants of the Ga$_{1-y}$In$_y$As optical-electric conversion layer 33 and the Ga$_{1-x}$In$_x$P optical-electric conversion layer 34 are smaller, and the Ge substrate 35 provides tensile stresses to the Ga$_{1-y}$In$_y$As optical-electric conversion layer 33 and the Ga$_{1-x}$In$_x$P optical-electric conversion layer 34. On the whole, the optical-electric conversion layers on the Ge substrate comprise the lattice constants equal to or smaller than the lattice constant of the Ge substrate 35, which means the upper stacks are effected by the tensile stress from the Ge substrate 35 that can generate bending or cracks and influence the quality and the yield of the devices.

SUMMARY OF THE DISCLOSURE

In accordance with one embodiment of the present application, a multi-junction solar cell device is provided, which includes a substrate comprising a first lattice constant; a first optical-electric conversion layer comprising a first band gap and a second lattice constant placed on the substrate; and a second optical-electric conversion layer comprising a second band gap and a third lattice constant placed on the first optical-electric conversion layer. Wherein, the first lattice constant is between the second lattice constant and the third lattice constant.

In accordance with another embodiment of the present application, a multi junction solar cell device is provided, which includes a first electrode; a substrate comprising a first lattice constant placed on a side of the first electrode; a first optical-electric conversion layer comprising a second lattice constant placed on the substrate to absorb a light in the first wavelength range to produce a first current; and a second optical-electric conversion layer comprising a third lattice constant placed on the first optical-electric conversion layer to absorb a light in the second wavelength range to produce a second current; and a second electrode placed on the second optical-electric conversion layer. Wherein, the first lattice constant is between the second lattice constant and the third lattice constant.

BRIEF DESCRIPTION OF THE DRAWINGS

The drawings are used to promote the realization of the present application and are a part of the specification. The embodiments shown in the drawings cooperate with the explanation in the "detailed description of preferred embodiments" part in the specification to illustrate the principle of the present application.

DETAILED DESCRIPTION OF PREFERRED EMBODIMENTS

The embodiments of present application are described in details hereinafter in accompany with drawings.

Figure 1:
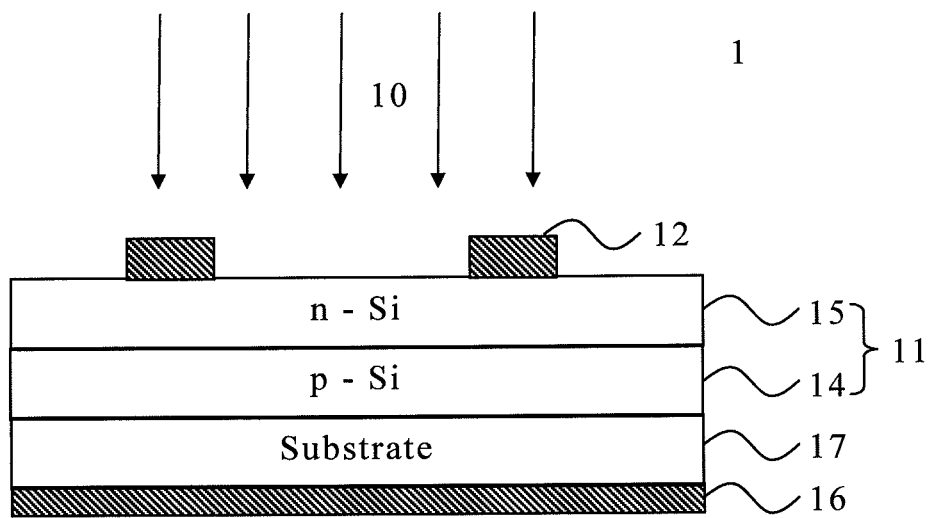
FIG. 1 illustrates a cross-sectional view of a conventional silicon-based solar cell device.
Figure 2:
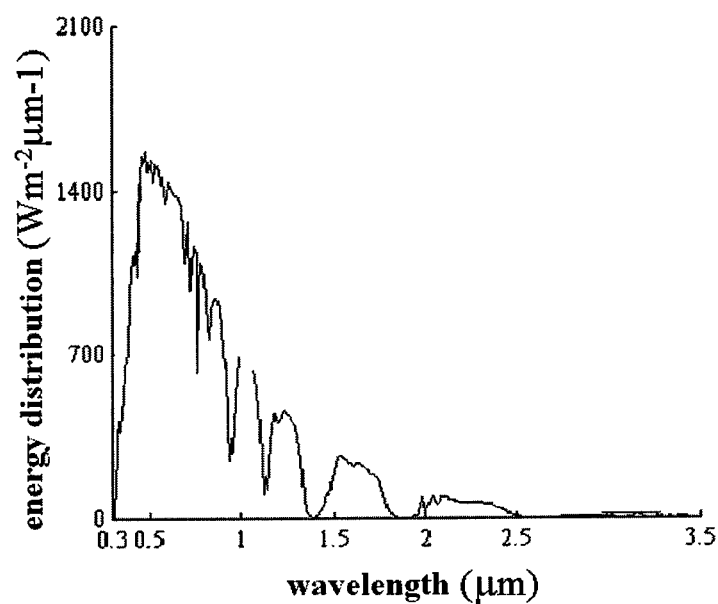
FIG. 2 illustrates a spectrum of the solar energy radiation on the surface of the earth.
Figure 3:
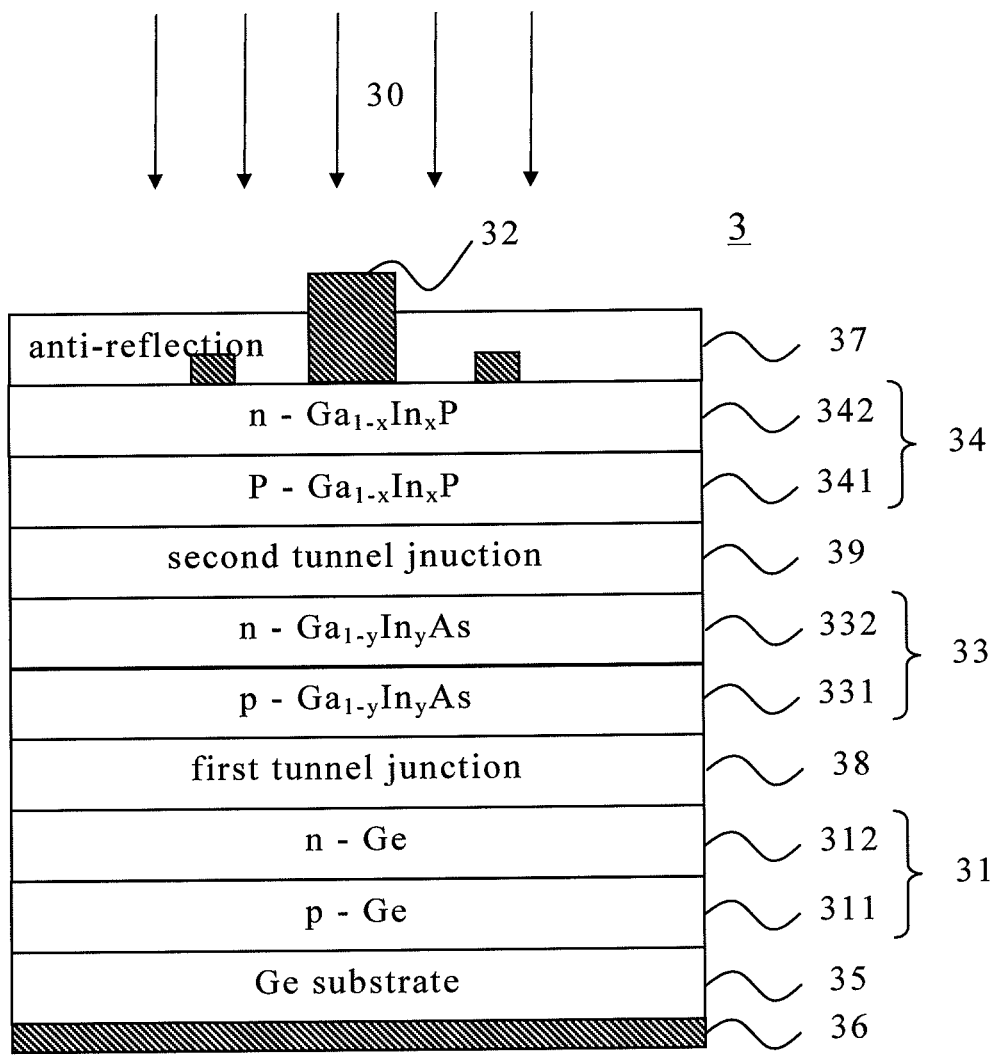
FIG. 3 illustrates a cross-sectional view of another conventional multi-junction solar cell device.
Figure 4:
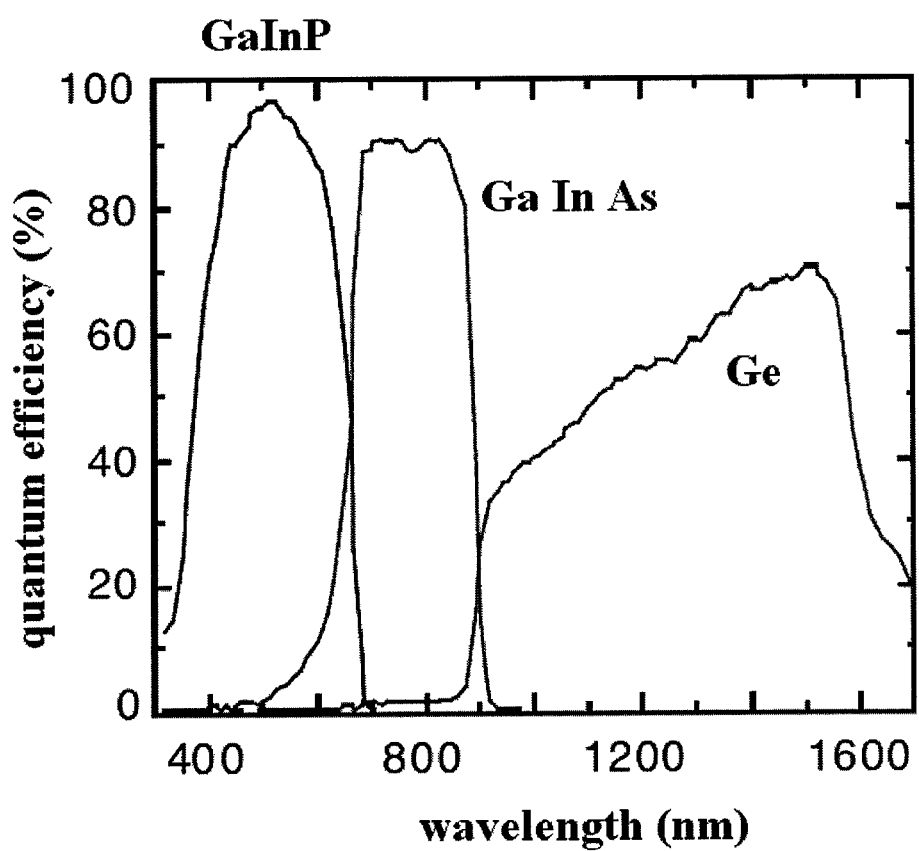
FIG. 4 illustrates a spectrum response diagram of the multi junction solar cell device shown in FIG. 3.
Figure 5:
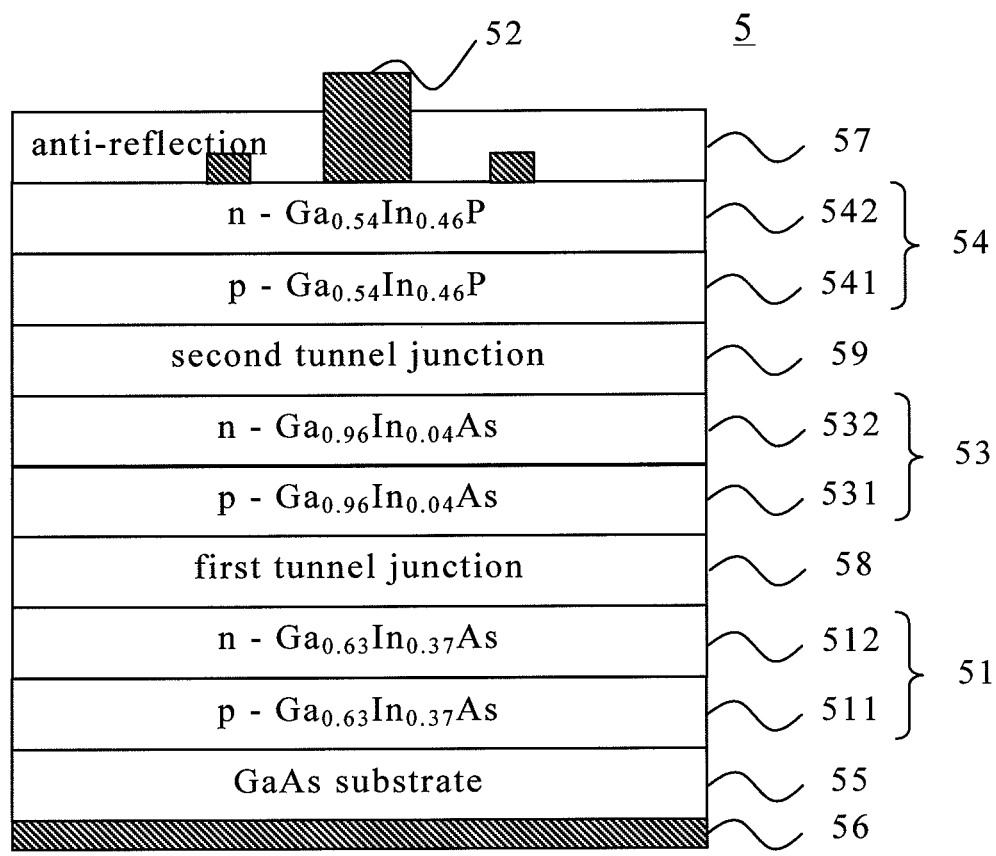
FIG. 5 illustrates a cross-sectional view of a multi-junction solar cell device in accordance with one embodiment of the present application.

FIG. 5 shows an embodiment in accordance with the present application. The multi-junction solar cell device 5 comprises a first electrode 52, a GaAs substrate 55, a first optical-electric conversion layer 51 of Ga$_{0.63}$In$_{0.37}$As composition, a second optical-electric conversion layer 53 of Ga$_{0.96}$In$_{0.04}$As composition, a third optical-electric conversion layer 54 of Ga$_{0.54}$In$_{0.46}$P composition, and a second electrode 56. Wherein, each optical-electric conversion layer is one p-n junction formed by the combination of a p-type semiconductor layer and an n-type semiconductor layer. Accordingly, the first Ga$_{0.63}$In$_{0.37}$As optical-electric conversion layer 51 is a p-n junction formed by the combination of a p-type Ga$_{0.63}$In$_{0.37}$As semiconductor layer 511 (p-Ga$_{0.63}$In$_{0.37}$As) and an n-type Ga$_{0.63}$In$_{0.37}$As semiconductor layer 512 (n-Ga$_{0.63}$In$_{0.37}$As); the second Ga$_{0.96}$In$_{0.04}$As optical-electric conversion layer 53 is a p-n junction formed by the combination of a p-type Ga$_{0.96}$In$_{0.04}$As semiconductor layer 531 (p-Ga$_{0.96}$In$_{0.04}$As) and an n-type Ga$_{0.96}$In$_{0.04}$As semiconductor layer 532 (n-Ga$_{0.96}$In$_{0.04}$As); the third Ga$_{0.54}$In$_{0.46}$P optical-electric conversion layer 54 is a p-n junction formed by the combination of a p-type Ga$_{0.54}$In$_{0.46}$P semiconductor layer 541 (p-Ga$_{0.54}$In$_{0.46}$P) and an n-type Ga$_{0.54}$In$_{0.46}$P semiconductor layer 542 (n-Ga$_{0.54}$In$_{0.46}$P).

Besides, a first tunnel junction 58 can be formed optionally between the first optical-electric conversion layer 51 and the second optical-electric conversion layer 53, and a second tunnel junction 59 can be formed optionally between the second optical-electric conversion layer 53 and the third optical-electric conversion layer 54. The tunnel junction locates between the optical-electric conversion layers to adjust the resistance between two adjacent optical-electric conversion layers, to reduce the charges accumulated near any side of the two optical-electric conversion layers, and to make the currents of the optical-electric conversion layers consistent. Wherein, the structure of the tunnel junction is generally a highly doped n-type or p-type semiconductor layer, the band gap of the tunnel junction is not smaller than the smaller band gap of the two adjacent optical-electric conversion layers, and is preferably not smaller than the larger band gap of the two adjacent optical-electric conversion layers. The structure of the tunnel junction mentioned above is therefore transparent for remaining sun light to pass through one optical-electrical conversion layer so the passed sun light can be absorbed again by subsequent optical-electric conversion layers.

In some embodiments, in order to achieve higher optical-electric conversion efficiency, an anti-reflective layer 57 can be formed optionally between the electrode 52 and the optical-electric conversion layer 54 to reduce the reflection from the surface of the structure.

In the following, the relationship of the structures between the substrate and the optical-electric conversion layer are discussed in details. In the embodiment, the lattice constant of the GaAs substrate is about 5.64 A. In order to absorb more light with long wavelength, the material of In is added in the composition to reduce the band gap of the optical-electric conversion layer. As mentioned in the embodiment, the material of the first optical-electric conversion layer can be $Ga_{0.63}In_{0.37}As$, and the second optical-electric conversion layer can be $Ga_{0.96}In_{0.04}As$. However, while the ratio of "In" in the composition raises, not only the band gap of the optical-electric conversion layer decreases, the lattice constant of the layer also increases. Comparing with the GaAs substrate 55, the first optical-electric conversion layer 51 and the second optical-electric conversion layer 53 comprising "In" have larger lattice constants. Therefore, the first optical-electric conversion layer 51 and the second optical-electric conversion layer 53 placed on the GaAs substrate 55 are effected by the compressive stress from the GaAs substrate 55, and the repeatedly added stress can generate bending or cracks in the manufacturing processes and influence the quality and the yield of the devices.

In this embodiment, comparing with the GaAs substrate 55, a material with a smaller lattice is selected to be used in the multi-junction solar cell device 5 to balance the internal stress of the device. Generally speaking, the device with the balanced internal stress has a better quality and a better stability. In other words, in order to balance the stress, the combination of a first optical-electric conversion layer 51 and a second optical-electric conversion layer 53 effected by the compressive stress and a third optical-electric conversion layer 54 effected by the tensile stress are selected, that is, the combination of a first optical-electric conversion layer 51 and a second optical-electric conversion layer 53 with the lattice constants larger than the lattice constant of the substrate 55 and a third optical-electric conversion layer 54 with the lattice constant smaller than the lattice constant of the substrate 55 are selected.

Of course, the spirit of this application is not limited to the embodiments mentioned above. Any person having ordinary skill in the art can modify or change the aforementioned embodiments by changing the three layers solar cell device into a two layer, a four layer, or another multi-layer solar cell device, the combination of the optical-electric conversion layers can be achieved by simultaneously selecting the combination comprising the layer affected by the compressive stress from the substrate and the layer affected by the tensile stress from the substrate to balance the internal stress and the number of each kind of the layer can be chosen optionally.

Besides, in order to reduce the unbalance between the GaAs substrate 55 and the first GaInAs optical-electric conversion layer 51, it is preferred the difference of the lattice constant between the GaAs substrate 55 and the first $Ga_{0.63}In_{0.37}As$ optical-electric conversion layer 51 is not larger than 6% of the lattice constant of the GaAs substrate 55. For the better case, the difference of the lattice constant between the GaAs substrate 55 and the first $Ga_{0.63}In_{0.37}As$ optical-electric conversion layer 51 is not larger than 3% of the lattice constant of the GaAs substrate 55. Take the embodiment in the application for example, the lattice constant of the first $Ga_{0.63}In_{0.37}As$ optical-electric conversion layer 51 is 5.80 A, the difference of the lattice constant with the GaAs substrate 55 (lattice constant 5.65 A) is (5.80 A−5.65 A)/5.65 A*100%=+2.65%; the lattice constant of the second $Ga_{0.96}In_{0.04}As$ optical-electric conversion layer 53 is 5.66 A, the difference of the lattice constant with the GaAs substrate 55 is (5.66 A−5.65 A)/5.65 A*100%=+0.18%; and the lattice constant of the third $Ga_{0.54}In_{0.46}P$ optical-electric conversion layer 54 is 5.64 A, the difference of the lattice constant with the GaAs substrate 55 is (5.64 A−5.65 A)/5.65 A*100%=−18%.

Figure 6:
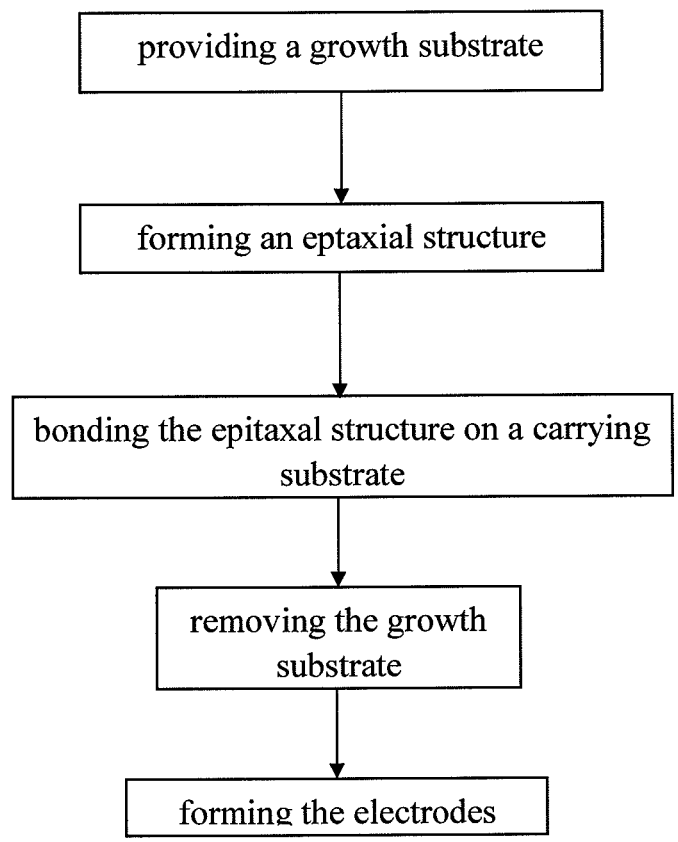
FIG. 6 illustrates a manufacturing process flow chart of a multi junction solar cell device in accordance with one embodiment of the present application.

FIG. 6 shows a manufacturing process flow chart of a solar cell device 5 in accordance with the embodiment of the application. The first step is to provide a growth substrate, and the material of the growth substrate can be selected from Ge, SiC, Si, InP, GeSi, ZnO, GaN, glass, metal, sapphire, and so on. Then, a stack structure is epitaxially formed on the growth structure. In the embodiment, the solar cell stack structure comprising the third $Ga_{0.54}In_{0.46}P$ optical-electric conversion layer 54, the second tunnel junction 59, the second $Ga_{0.96}In_{0.04}As$ optical-electric conversion layer 53, the first tunnel junction 58, the first $Ga_{0.63}In_{0.37}As$ optical-electric conversion layer 51 is formed on the growth substrate 55. In order to maintain the good quality of the solar cell structure, it is preferred to choose the material of the first optical-electric conversion layer with the lattice constant close to the lattice constant of the substrate to avoid the formation of the dislocation generated from the large difference of the lattice constants between the growth substrate and the optical-electric conversion layer, and the dislocations also degrade the quality of the following growing epitaxial layers. Therefore, in the embodiment, the third $Ga_{0.54}In_{0.46}P$ optical-electric conversion layer 54 is the first grown layer, following with the second tunnel junction 59, the second $Ga_{0.96}In_{0.04}As$ optical-electric conversion layer 53, the first tunnel junction 58, and the last is the first $Ga_{0.63}In_{0.37}As$ optical-electric conversion layer 51 which has the largest lattice constant difference with the growth substrate. However, the proportions of the band gaps of the epitaxial layers gradually from the growth substrate upward are inverted in the absorbing order mentioned above. Therefore, the third step is bonding the inverted epitaxial layers on a carrying substrate to turn the epitaxial layers upside down to make a multi junction solar cell with the appropriate absorbing band gap order. The structure with the carrying substrate is called an IMM (Inverted Metamorphic Multi-junction) structure. And then, the growth substrate of the device is removed. The removing method can be chosen from the traditional method such as dry etching, wet etching and so on. The material of the carrying substrate can be selected from Ge, SiC, Si, InP, GeSi, ZnO, GaN, glass, metal, sapphire, and so on. Finally, forming a first electrode 52 and a second electrode 56 to transmit the current formed from the solar cell device to the external power supply equipment, the power storage equipment, or the power conversion equipment. Of course, the spirit of this application is not limited to the embodiments mentioned above. Any person having ordinary skill in the art can modify or change the aforementioned embodiments by adding the process steps such as the process of forming the buffer layer, forming the cladding layer, or forming the transparent conductive layer and so on.

Figure 7:
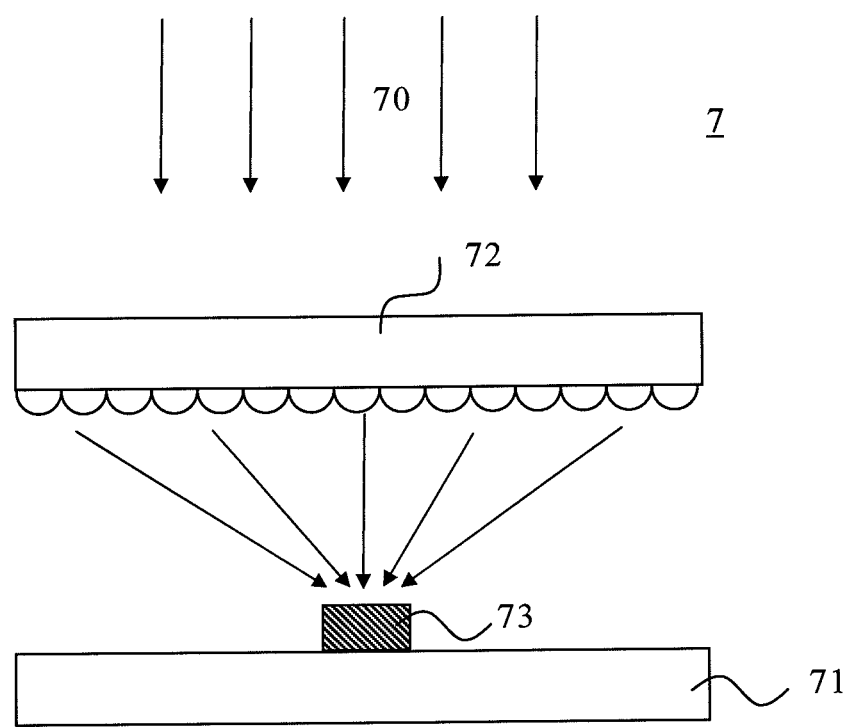
FIG. 7 illustrates a cross-sectional view of a multi junction solar cell apparatus in accordance with one embodiment of the present application.

FIG. 7 shows a solar cell apparatus comprising a multi-junction solar cell device in accordance with the present application. As shown in FIG. 7, the solar cell apparatus further comprises a heat dissipating base 71, and the multi-junction solar cell device 73 is placed on the heat dissipating base 71. Through the heat dissipating base 71, the redundant heat produced during the operation can be dissipated outwardly. Besides, a light collecting apparatus 72 such as a Fresnel lens system is further placed on the multi junction solar cell device 73 collect and condense the sun light dispersing to the large area to the surface of the small multi-junction solar cell device 73 and to enhance the electricity generating efficiency.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A multi-junction solar cell device, comprising:
a substrate comprising a first lattice constant;
a first optical-electric conversion layer formed on the substrate and comprising a first band gap and a second lattice constant;
a second optical-electric conversion layer formed on the first optical-electric conversion layer and comprising a second band gap and a third lattice constant; and
a third optical-electric conversion layer formed on the second optical-electric conversion layer and comprising Ga, In, P and a fourth lattice constant,
wherein the second lattice constant and the third lattice constant are larger than the first lattice constant,
wherein the fourth lattice constant is smaller than the first lattice constant, wherein the first optical-electric conversion layer and the second optical-electric conversion layer comprise Ga, As and In in different ratios,
wherein the first optical-electric conversion layer has an In ratio smaller than that of the third optical-electric conversion layer, and
wherein each of the optical-electric conversion layers comprises three different elements.

2. The multi-junction solar cell device of claim 1, wherein the first band gap is smaller than the second band gap.

3. The multi-junction solar cell device of claim 1, wherein the first optical-electric conversion layer comprises $Ga_{1-a}In_aAs$, and $0.35<a<0.45$.

4. The multi-junction solar cell device of claim 1, wherein a difference between the first lattice constant and the second lattice constant is not larger than 6% of the first lattice constant.

5. The multi-junction solar cell device of claim 1, wherein a difference between the first lattice constant and the second lattice constant is not larger than 3% of the first lattice constant.

6. A multi-junction solar cell device, comprising:
a first electrode;
a substrate formed on the first electrode and comprising a first lattice constant;
a first optical-electric conversion layer formed on the substrate and comprising a second lattice constant, the first optical-electric conversion layer being configured to absorb a light in a first wavelength range to produce a first current;
a second optical-electric conversion layer, formed on the first optical-electric conversion layer and comprising a third lattice constant, the second optical-electric conversion layer being configured to absorb a light in a second wavelength range to produce a second current;
a third optical-electric conversion layer formed on the second optical-electric conversion layer and comprising Ga, In, P and a fourth lattice constant; and
a second electrode formed on the third optical-electric conversion layer,
wherein the second lattice constant and the third lattice constant are larger than the first lattice constant,
wherein the fourth lattice constant is smaller than the first lattice constant, wherein the first optical-electric conversion layer and the second optical-electric conversion layer comprise Ga, As and In in different ratios,
wherein the first optical-electric conversion layer has an In ratio smaller than that of the third optical-electric conversion layer, and
wherein each of the optical-electric conversion layers comprises three different elements.

7. The multi-junction solar cell device of claim 6, wherein the third optical-electric conversion layer is configured to absorb a light in the third wavelength range to produce a third current.

8. The multi-junction solar cell device of claim 6, wherein the first wavelength range is larger than the second wavelength range.

9. The multi-junction solar cell device of claim 6, wherein the first optical-electric conversion layer comprises $Ga_{1-a}In_aAs$, and $0.35<a<0.45$.

10. The multi-junction solar cell device of claim 6, wherein a difference between the first lattice constant and the second lattice constant is not larger than 6% of the first lattice constant.

11. The multi-junction solar cell device of claim 6, wherein a difference between the first lattice constant and the second lattice constant is not larger than 3% of the first lattice constant.

12. A multi-junction solar cell apparatus, comprising:
a multi-junction solar cell device, comprising:
a first electrode;
a substrate formed on the first electrode and comprising a first lattice constant;
a first optical-electric conversion layer formed on the substrate and comprising a second lattice constant, the first optical-electric conversion layer being configured to absorb a light in a first wavelength range to produce a first current;
a second optical-electric conversion layer, formed on the first optical-electric conversion layer and comprising a third lattice constant, the second optical-electric conversion layer being configured to absorb a light in a second wavelength range to produce a second current;
a third optical-electric conversion layer formed on the second optical-electric conversion layer and comprising Ga, In, P and a fourth lattice constant; and
a second electrode formed on the third optical-electric conversion layer; and
a light collecting apparatus formed on the multi junction solar cell device;

wherein the second lattice constant and the third lattice constant are larger than the first lattice constant, wherein the fourth lattice constant is smaller than the first lattice constant, wherein the first optical-electric conversion layer and the second optical-electric conversion layer comprise Ga, As and In in different ratios, wherein the first optical-electric conversion layer has an In ratio smaller than that of the third optical-electric conversion layer, and wherein each of the optical-electric conversion layers comprises three different elements.

13. The multi-junction solar cell apparatus of claim 12, wherein the light collecting apparatus comprises a Fresnel lens.

14. The multi-junction solar cell apparatus of claim 12, further comprising a heat dissipating base on which the multi-junction solar cell device is arranged.

15. The multi-junction solar cell apparatus of claim 12, wherein the third optical-electric conversion layer is configured to absorb a light in a third wavelength range to produce a third current.

16. The multi-junction solar cell apparatus of claim 12, wherein the first wavelength range is larger than the second wavelength range.

17. The multi-junction solar cell apparatus of claim 12, wherein the first optical-electric conversion layer comprises $Ga_{1-a}In_aAs$, and $0.35<a<0.45$.

* * * * *